(12) United States Patent
Shimizu et al.

(10) Patent No.: US 8,324,710 B2
(45) Date of Patent: Dec. 4, 2012

(54) CAPACITOR, INTEGRATED DEVICE, RADIO FREQUENCY SWITCHING DEVICE, AND ELECTRONIC APPARATUS

(75) Inventors: Toshiyuki Shimizu, Kanagawa-ken (JP); Masayuki Sugiura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/043,988

(22) Filed: Mar. 9, 2011

(65) Prior Publication Data

US 2011/0234016 A1 Sep. 29, 2011

(30) Foreign Application Priority Data

Mar. 24, 2010 (JP) .................................. 2010-068761

(51) Int. Cl.
*H01L 29/92* (2006.01)
(52) U.S. Cl. .. 257/532; 257/531; 257/306; 257/E29.343
(58) Field of Classification Search .................. 257/306, 257/531–532, E29.343
See application file for complete search history.

(56) References Cited

U.S. PATENT DOCUMENTS

2004/0235245 A1* 11/2004 Summerfelt .................. 438/257

FOREIGN PATENT DOCUMENTS

| CN | 101540324 A | 9/2009 |
|---|---|---|
| JP | 58-061660 | 4/1983 |
| JP | 10313094 | 11/1998 |
| JP | 2003203979 | 7/2003 |
| JP | 2003-347553 | 12/2003 |
| JP | 2004-228188 | 8/2004 |
| JP | 2006-165571 | 6/2006 |
| JP | 2008244403 | 10/2008 |
| JP | 2009-224637 | 10/2009 |
| JP | 2009-290179 | 12/2009 |
| JP | 2010021234 | 1/2010 |

OTHER PUBLICATIONS

Chinese Office Action for Chinese Application No. 201110051302.8 issued on Feb. 14, 2012.
Japanese Office Action for Japanese Application No. 2010-068761 mailed on Jul. 23, 2012.

* cited by examiner

*Primary Examiner* — Cuong Q Nguyen
*Assistant Examiner* — Tran Tran
(74) *Attorney, Agent, or Firm* — Turocy & Watson, LLP

(57) ABSTRACT

According to one embodiment, a capacitor includes a substrate, a first electrode, a second electrode, and a first dielectric portion. The substrate includes an insulating layer and a semiconductor layer provided on the insulating layer. The semiconductor layer includes a dummy active region electrically isolated from an active region including an active element. The first electrode and the second electrode are located to oppose each other above the dummy active region. The first dielectric portion is provided between the first electrode and the second electrode.

8 Claims, 12 Drawing Sheets

CAPACITOR, INTEGRATED DEVICE, RADIO FREQUENCY SWITCHING DEVICE, AND ELECTRONIC APPARATUS

CROSS-REFERENCE TO RELATED APPLICATIONS

This application is based upon and claims the benefit of priority from the prior Japanese Patent Application No. 2010-068761, filed on Mar. 24, 2010; the entire contents of which are incorporated herein by reference.

FIELD

Embodiments described herein relate generally to a capacitor, an integrated device, a radio frequency switching device, and an electronic apparatus.

BACKGROUND

In the semiconductor manufacturing process, a semiconductor substrate is subjected to film formation, photolithography, and impurity doping to form active elements such as transistors and diodes, and passive elements such as resistors and capacitors. JP-A 2008-244403 (Kokai) discloses a semiconductor device and a method for manufacturing the same capable of increasing the capacitance of a MOS capacitor without increasing the area of the MOS capacitor.

In the process for manufacturing a semiconductor device including CMOS (complementary metal oxide semiconductor) transistors, active elements such as CMOS transistors are formed in an active region. On the other hand, a dummy active region is defined outside the active region. This dummy active region is subjected to the same process as the active region. However, the dummy active region does not function as active elements. The dummy active region is provided in a prescribed proportion outside the active region on the substrate. Thus, the pressure is made uniform when the insulating film, for instance, formed on the active region and the dummy active region is planarized.

The active region and the dummy active region are both conductive regions made of semiconductor doped with impurity. Furthermore, the active region and the dummy active region are connected through the substrate. Here, a capacitor may be located outside the active region. In this case, to reduce the influence of signals handled in the active region, the capacitor is located off the space above the dummy active region. This makes it difficult to achieve a sufficient capacitance density of the capacitor on the substrate with limited area.

DETAILED DESCRIPTION

Figure 1A:
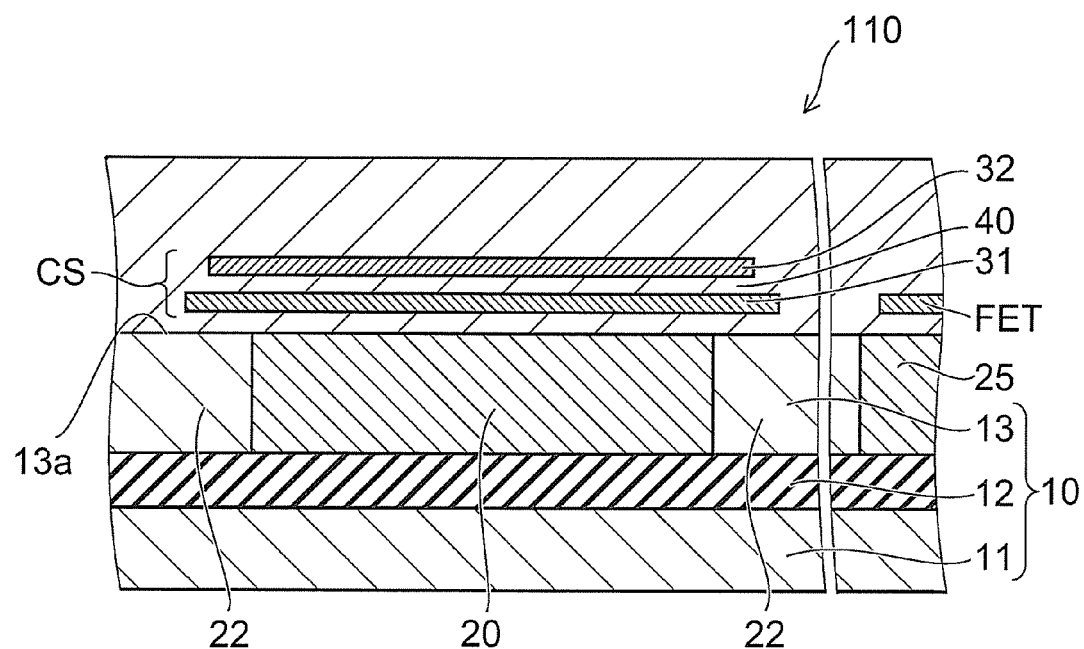
FIGS. 1A and 1B are schematic views illustrating an example configuration of a capacitor according to a first embodiment.

In general, according to one embodiment, a capacitor includes a substrate, a first electrode, a second electrode, and a first dielectric portion. The substrate includes an insulating layer and a semiconductor layer provided on the insulating layer. The semiconductor layer includes a dummy active region electrically isolated from an active region including an active element. The first electrode and the second electrode are located to oppose each other above the dummy active region. The first dielectric portion is provided between the first electrode and the second electrode.

According to another embodiment, an integrated device includes a substrate, an active element, a first electrode, a second electrode, and a first dielectric portion. The substrate includes an insulating layer and a semiconductor layer provided on the insulating layer. The semiconductor layer includes an active region and a dummy active region electrically isolated from the active region. The active element is formed in the active region. The first electrode and the second electrode are located to oppose each other above the dummy active region. The first dielectric portion is provided between the first electrode and the second electrode.

According to yet another embodiment, a radio frequency switching device includes a substrate, a radio frequency switching circuit, a control circuit, a first electrode, a second electrode, and a first dielectric portion. The substrate includes an insulating layer and a semiconductor layer provided on the insulating layer. The semiconductor layer includes a first active region, a second active region, and a dummy active region electrically isolated from the first active region and the second active region. The radio frequency switching circuit is provided in the first active region of the substrate. The control circuit is provided in the second active region of the substrate and configured to control the radio frequency switching circuit. The first electrode and the second electrode are located to oppose each other above the dummy active region. The first dielectric portion is provided between the first electrode and the second electrode.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the specification and the drawings of the application, components similar to those described previously with reference to earlier figures are labeled with like reference numerals, and the detailed description thereof is omitted as appropriate.

First Embodiment

Figure 1B:
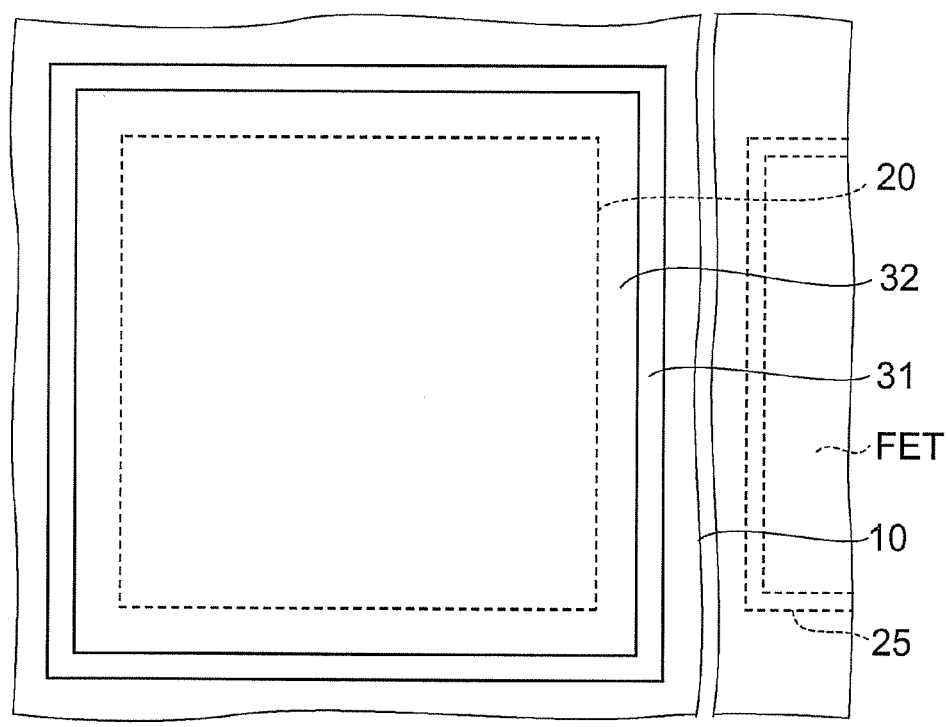

FIGS. 1A and 1B are schematic views illustrating an example configuration of a capacitor according to a first embodiment.

Here, FIG. 1A is a schematic cross-sectional view of the capacitor. FIG. 1B is a schematic plan view of the capacitor.

As shown in FIGS. 1A and 1B, the capacitor 110 according to the first embodiment includes a substrate 10, a first electrode 31, a second electrode 32, and a first dielectric portion 40.

The substrate 10 has a structure in which a semiconductor layer 13 is formed on an insulating material such as SOI (silicon on insulator) and SOS (silicon on sapphire). The substrate 10 illustrated in FIGS. 1A and 1B is based on SOI. That is, the substrate 10 includes an insulating layer 12 formed on a support substrate 11 such as a silicon substrate, and a semiconductor layer 13 provided on the insulating layer 12. The insulating layer 12 is made of e.g. silicon oxide. The semiconductor layer 13 is made of e.g. silicon. In SOS; sapphire is used for both the support substrate 11 and the insulating layer 12.

A dummy active region 20 is provided in the semiconductor layer 13 of the substrate 10. The dummy active region 20 is a partial region of the semiconductor layer 13 of the substrate 10. Broadly speaking, the semiconductor layer 13 includes a conductive region made of semiconductor doped with impurity, and an isolation region for isolating the conductive region. The conductive region includes an active region including active elements such as transistors and diodes, and a dummy active region 20 not functioning as active elements. The dummy active region 20 is subjected to nearly the same manufacturing process as the active region.

In the substrate 10, the dummy active region 20 is provided in a prescribed proportion outside the active region. If the dummy active region 20 is located in a prescribed proportion, the pressure applied to the substrate 10 is made uniform when various films formed on the substrate 10 are planarized. That is, the dummy active region 20 has a hardness comparable to that of the active region to serve as a foundation in planarizing the film formed on the substrate 10.

The dummy active region 20 is electrically isolated from the active region by the isolation region 22. The isolation region 22 is made of e.g. STI (shallow trench isolation). The isolation region 22 extends from the surface of the semiconductor layer 13 to the insulating layer 12. This electrically isolates the dummy active region 20 from the active region.

The first electrode 31 and the second electrode 32 are located to oppose each other above the dummy active region 20. The first electrode 31 and the second electrode 32 are made of e.g. conductive polycrystalline silicon (polysilicon). Besides polysilicon, the first electrode 31 and the second electrode 32 may be made of metal films.

The first electrode 31 and the second electrode 32 each are provided to extend along the major surface 13a of the semiconductor layer 13. The first electrode 31 and the second electrode 32 illustrated in FIGS. 1A and 1B are provided in a rectangular shape along the major surface 13a of the semiconductor layer 13. The first electrode 31 is located with a prescribed spacing from the major surface 13a of the semiconductor layer 13. The second electrode 32 is located with a prescribed spacing from the first electrode 31.

The first dielectric portion 40 is provided between the first electrode 31 and the second electrode 32. The first dielectric portion 40 is made of e.g. silicon oxide. The first dielectric portion 40 illustrated in FIGS. 1A and 1B is provided not only between the first electrode 31 and the second electrode 32, but also between various films formed on the substrate 10. That is, in this example, the first dielectric portion 40 functions also as an interlayer insulating film. However, the first dielectric portion 40 may be provided independently of the other interlayer films.

In the capacitor 110 according to this embodiment, the first electrode 31 and the second electrode 32 in combination with the first dielectric portion 40 located therebetween form a structured body CS for accumulating charge.

In the capacitor 110 according to this embodiment, the structured body CS is located above the dummy active region 20. Besides above the dummy active region 20, the structured body CS may be provided to extend to the adjacent isolation region 22.

Here, the dummy active region 20 is electrically isolated from the active region. Hence, even if the structured body CS is located above the dummy active region 20, the structured body CS is less susceptible to signals handled in active elements formed in the active region. Hence, the space above the dummy active region 20 can be effectively utilized as a locatable region for the structured body CS. Thus, even with limited area, a sufficient capacitance density is obtained.

Comparative Example

Figure 2A:
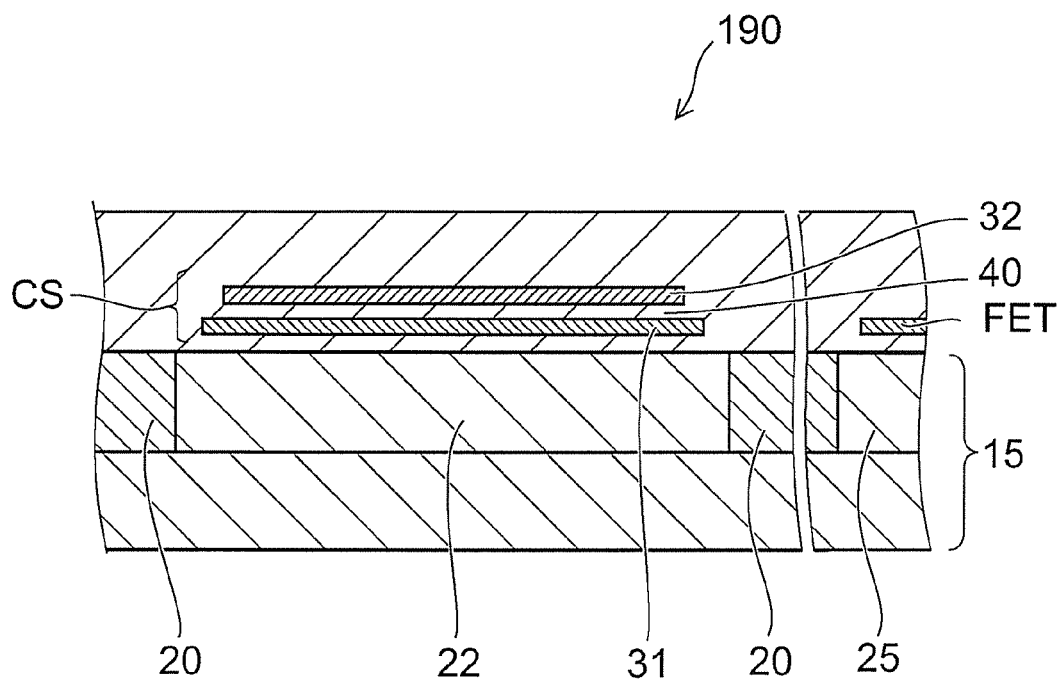
FIGS. 2A and 2B are schematic views illustrating an example configuration of a capacitor according to a comparative example.
Figure 2B:
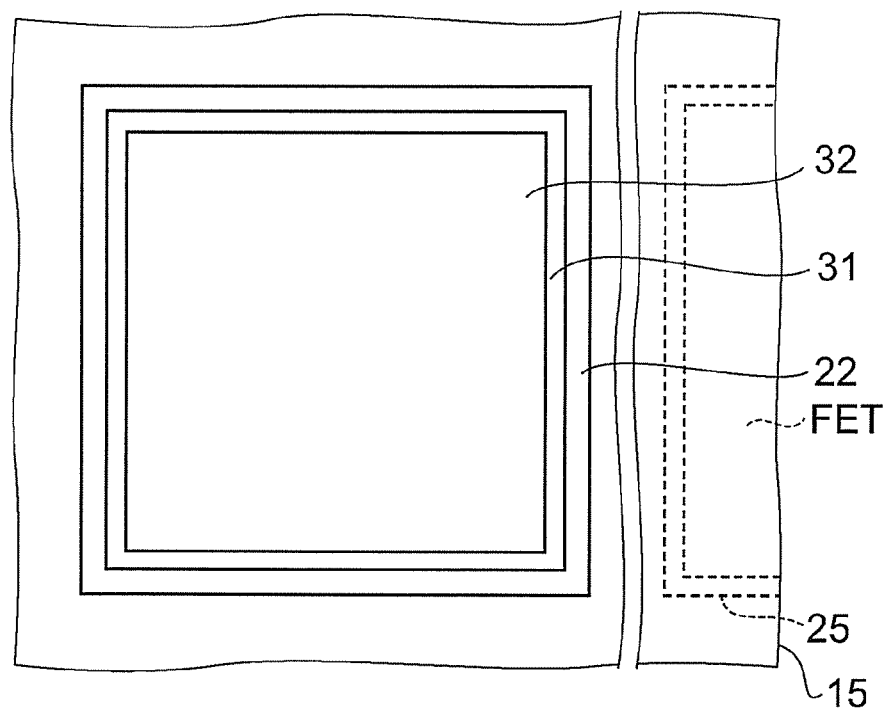

FIGS. 2A and 2B are schematic views illustrating an example configuration of a capacitor according to a comparative example.

Here, FIG. 2A is a schematic cross-sectional view of the capacitor. FIG. 2B is a schematic plan view of the capacitor.

As shown in FIGS. 2A and 2B, the capacitor 190 according to the comparative example includes a substrate 15, an isolation region 22, a first electrode 31, a second electrode 32, and a first dielectric portion 40.

The substrate 15 is e.g. a silicon substrate. The substrate 15 includes a dummy active region 20 and an isolation region 22. The isolation region 22 is selectively provided in the dummy active region 20. The dummy active region 20 is isolated from the active region, not shown, by the isolation region 22. However, the dummy active region 20 is in electrical continuity with the active region through the inside of the substrate 15.

The first electrode 31 and the second electrode 32 are located above the isolation region 22 of the substrate 15. The first dielectric portion 40 is provided between the first electrode 31 and the second electrode 32. The first electrode 31 and the second electrode 32 in combination with the first dielectric portion 40 located therebetween form a structured body CS for accumulating charge.

In the capacitor 190 according to the comparative example, the structured body CS is located above the isolation region 22. In this point, the capacitor 190 is different from the capacitor 110 according to this embodiment in which the structured body CS is located above the dummy active region 20.

More specifically, in the capacitor 190 according to the comparative example, the dummy active region 20 is in electrical continuity with the active region through the inside of the substrate 15. Hence, the influence of signals handled in active elements formed in the active region is transmitted to the dummy active region 20 through the inside of the substrate 15. In the capacitor 190 according to the comparative example, in order to reduce this influence of signals, the structured body CS is located not above the dummy active region 20 but above the isolation region 22.

Figure 3A:
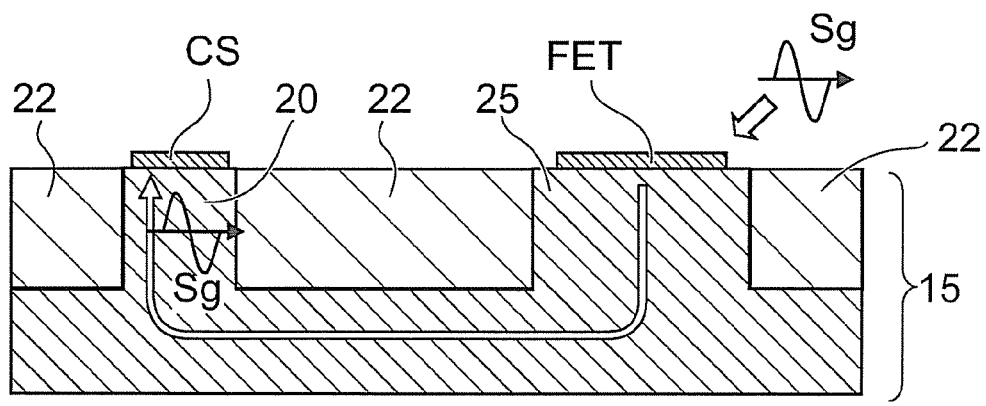
FIGS. 3A and 3B are schematic views for comparing the influence of signals.
Figure 3B:
Figure 3B:
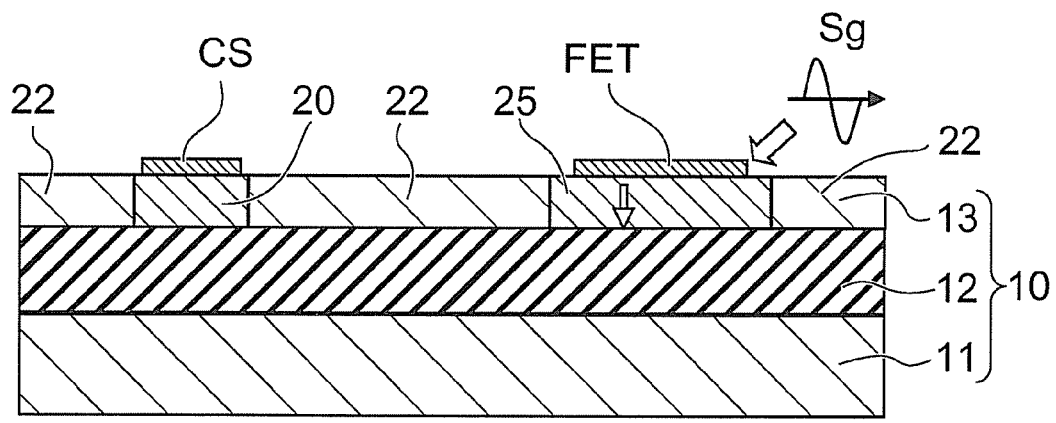

FIGS. 3A and 3B are schematic views for comparing the influence of signals.

Here, FIG. 3A illustrates the flow of a signal for the case where the structured body CS is located above the dummy active region 20 of the substrate 15.

FIG. 3B illustrates the flow of a signal for the case where the structured body CS is located above the dummy active region 20 of the substrate 10.

As shown in FIG. 3A, in the substrate 15, the signal Sg handled in the active element FET formed in the active region 25 is transmitted to the dummy active region 20 through the inside of the substrate 15. Hence, if the structured body CS is located above the dummy active region 20, the structured body CS is affected by the signal Sg transmitted from the active region 25. For instance, in the case where the active element FET handles a radio frequency signal Sg, the structured body CS cannot sufficiently realize its characteristics due to the influence of the radio frequency signal Sg.

On the other hand, as shown in FIG. 3B, in the substrate 10, the active region 25 is electrically isolated from the dummy active region 20 by the isolation region 22 and the insulating layer 12. Hence, the signal Sg handled in the active element FET formed in the active region 25 is not transmitted to the dummy active region 20. Thus, even if the structured body CS is located above the dummy active region 20, the structured body CS is less susceptible to the signal Sg.

The capacitor 190 according to the comparative example is based on the substrate 15. Hence, to prevent the influence of the signal Sg, the structured body CS is not located above the dummy active region 20. That is, the location of the structured body CS is limited to above the isolation region 22.

In contrast, the capacitor 110 according to this embodiment is based on the substrate 10. Thus, the structured body CS is less susceptible to the signal Sg even above the dummy active region 20. Hence, in the capacitor 110, the structured body CS can be located not only above the isolation region 22 but also above the dummy active region 20. That is, the location of the structured body CS is not limited to above the isolation region 22.

Thus, the capacitor 110 according to this embodiment has less restriction on the location of the structured body CS than the capacitor 190 according to the comparative example. Hence, as compared with the capacitor 190, the capacitor 110 can achieve a sufficient capacitance density even with limited area.

By way of example, in the case of using substrates with the same area including the same active region 25, the capacitance density of the capacitor 110 is approximately 20% higher than the capacitance density of the capacitor 190.

Second Embodiment

Figure 4A:
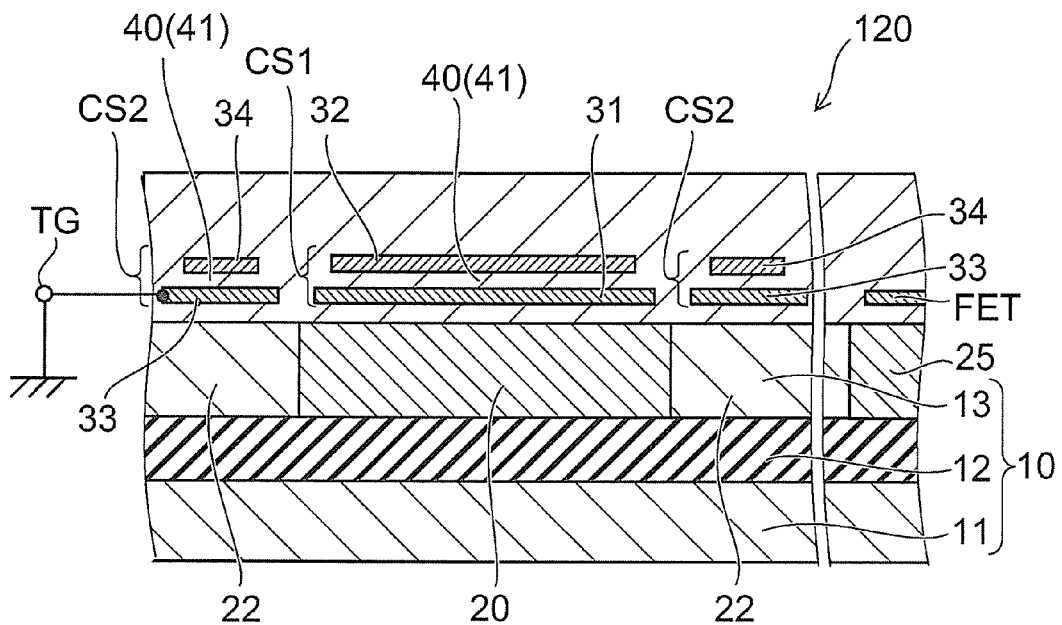
FIGS. 4A and 4B are schematic views illustrating an example configuration of a capacitor according to a second embodiment.
Figure 4B:
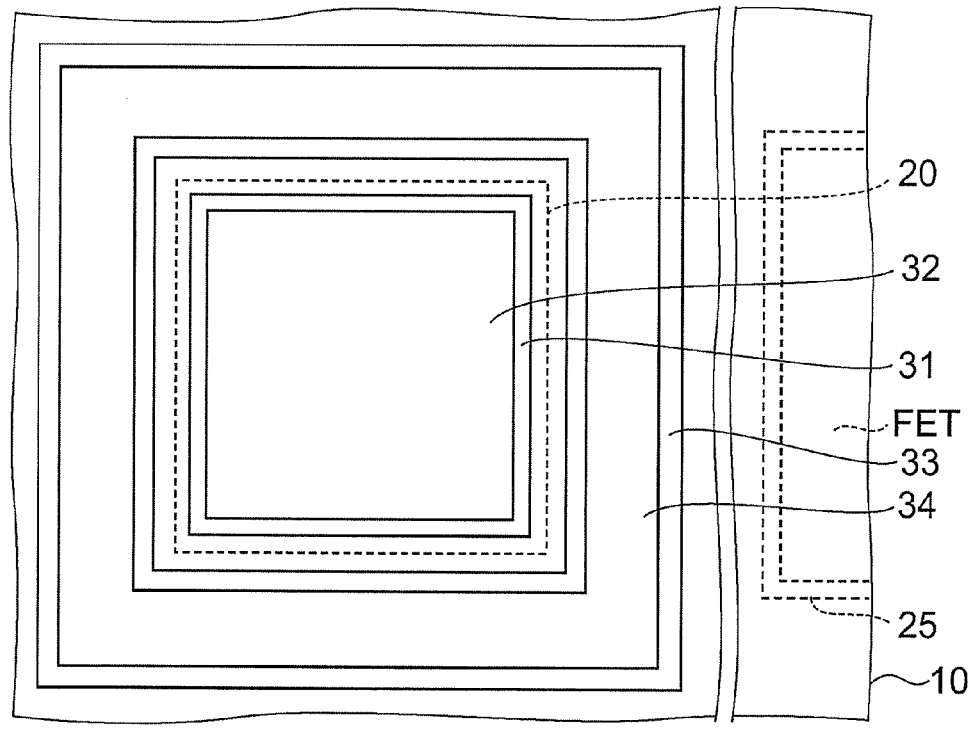

FIGS. 4A and 4B are schematic views illustrating an example configuration of a capacitor according to a second embodiment.

Here, FIG. 4A is a schematic cross-sectional view of the capacitor. FIG. 4B is a schematic plan view of the capacitor.

As shown in FIGS. 4A and 4B, the capacitor 120 according to the second embodiment includes a substrate 10, a first electrode 31, a second electrode 32, a first dielectric portion 40, a third electrode 33, a fourth electrode 34, and a second dielectric portion 41. Furthermore, the capacitor 120 includes a ground terminal TG placed at a ground potential.

The third electrode 33 and the fourth electrode 34 are located to oppose each other above the semiconductor layer 13 of the substrate 10. Furthermore, the third electrode 33 and the fourth electrode 34 are located around the periphery of the first electrode 31 and the second electrode 32. Besides polysilicon, the first electrode 31 and the second electrode 32 may be made of metal films.

The third electrode 33 and the fourth electrode 34 illustrated in FIGS. 4A and 4B are located above the isolation region 22. However, the third electrode 33 and the fourth electrode 34 may be located above the dummy active region 20.

The second dielectric portion 41 is located between the third electrode 33 and the fourth electrode 34. Here, the second dielectric portion 41 may be either shared with or independent of the first dielectric portion 40. The second dielectric portion 41 illustrated in FIGS. 4A and 4B is shared with the first dielectric portion 40. The second dielectric portion 41 is made of e.g. silicon oxide.

One of the third electrode 33 and the fourth electrode 34 is connected to the ground terminal TG. In the capacitor 120 according to this embodiment, the third electrode 33 is connected to the ground terminal TG.

In the capacitor 120 according to this embodiment, the first electrode 31 and the second electrode 32 in combination with the first dielectric portion 40 located therebetween form a structured body CS1 for accumulating charge. Furthermore, the third electrode 33 and the fourth electrode 34 in combination with the second dielectric portion 41 located therebetween form a structured body CS2 for accumulating charge.

Such a structured body CS2 functions as a shield for protecting the structured body CS1. More specifically, the structured body CS1 is surrounded by the structured body CS2, and the third electrode 33 or the fourth electrode 34 of the structured body CS2 is grounded. Thus, the structured body CS2 functions as a protective shield for preventing the structured body CS1 from being affected by signals handled in active elements.

The capacitor 120 according to the second embodiment includes the structured body CS2 in addition to the structured body CS1. Hence, the capacitance density can be made even higher than in the capacitor 110. Furthermore, the shield function of the structured body CS2 allows the structured body CS1 to sufficiently realize its characteristics.

Besides the configuration of surrounding one structured body CS, the structured body CS2 may be configured to collectively surround a plurality of structured bodies CS.

Third Embodiment

Figure 5A:
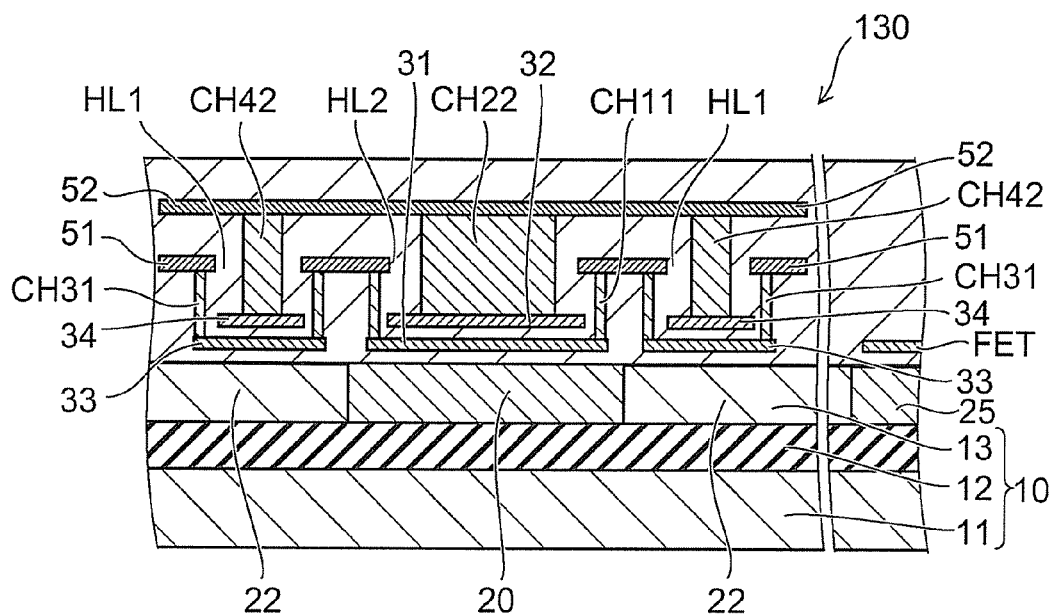
FIGS. 5A and 5B are schematic views illustrating an example configuration of a capacitor according to a third embodiment.
Figure 5B:
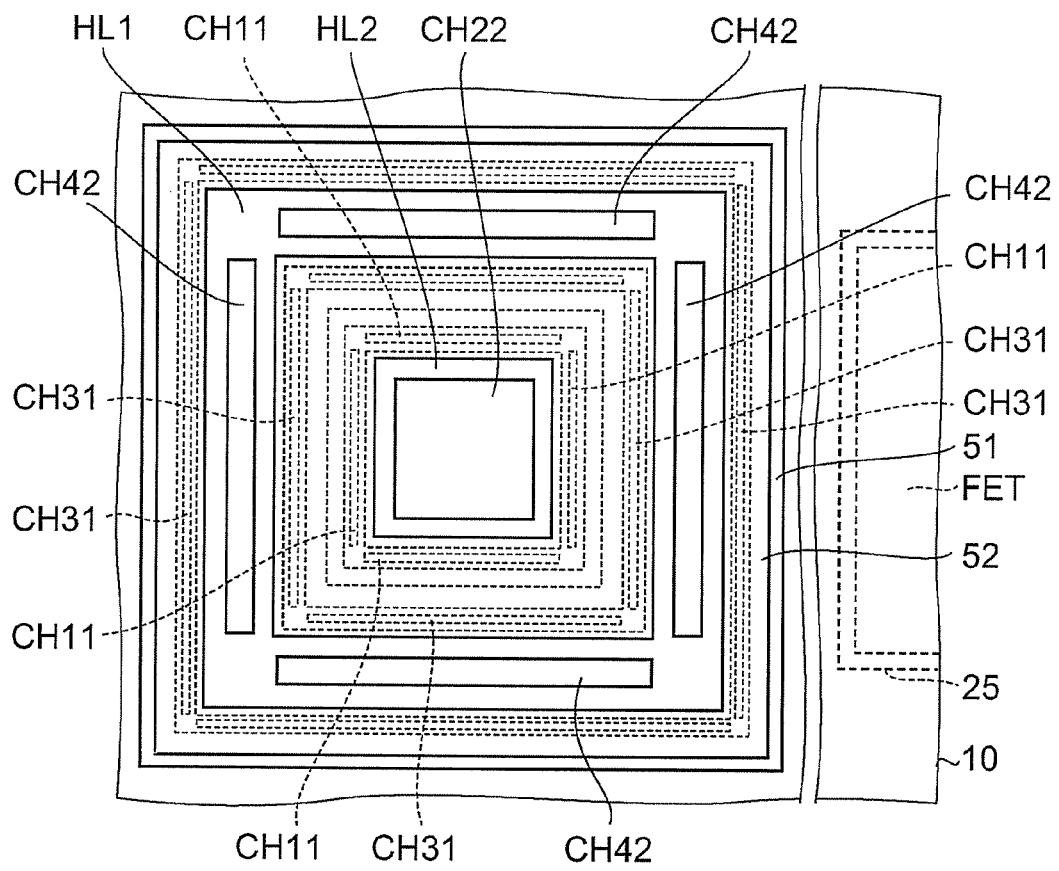

FIGS. 5A and 5B are schematic views illustrating an example configuration of a capacitor according to a third embodiment.

Here, FIG. 5A is a schematic cross-sectional view of the capacitor. FIG. 5B is a schematic plan view of the capacitor.

As shown in FIGS. 5A and 5B, the capacitor 130 according to the third embodiment includes a substrate 10, a first electrode 31, a second electrode 32, a first dielectric portion 40, a third electrode 33, a fourth electrode 34, and a second dielectric portion 41.

Furthermore, the capacitor 130 includes a first wiring 51 and a second wiring 52. The first wiring 51 and the second wiring 52 are made of e.g. metal.

The first electrode 31 and the third electrode 33 are in electrical continuity with the first wiring 51. The second electrode 32 and the fourth electrode 34 are in electrical continuity with the second wiring 52.

To establish electrical continuity with the first wiring 51, a contact hole CH11 is provided between the first electrode 31 and the first wiring 51. The contact hole CH11 is connected at one end to the peripheral portion of the first electrode 31, penetrates through the interlayer insulating film (first dielectric portion 40) outside the second electrode 32, and is connected at the other end to the first wiring 51. Furthermore, a contact hole CH31 is provided between the third electrode 33 and the first wiring 51. The contact hole CH31 is connected at one end to the peripheral portion of the third electrode 33, penetrates through the interlayer insulating film (second dielectric portion 41) outside the fourth electrode 34, and is connected at the other end to the first wiring 51.

As shown in FIG. 5B, the contact hole CH11 is located along the outline of the second electrode 32. The contact hole CH11 illustrated in FIG. 5B is located along each side of the rectangular second electrode 32. Furthermore, the contact hole CH31 is located along a hole HL1 provided in the first wiring 51.

To establish electrical continuity with the second wiring 52, a contact hole CH22 is provided between the second electrode 32 and the second wiring 52. The contact hole CH22 is connected at one end to the central portion of the second electrode 32, penetrates through the interlayer insulating film via a hole HL2 provided in the first wiring 51, and is connected at the other end to the second wiring 52. Furthermore, a contact hole CH42 is provided between the fourth electrode 34 and the second wiring 52. The contact hole CH42 is connected at one end to the central portion of the fourth electrode 34, penetrates through the interlayer insulating film via the hole HL1 provided in the first wiring 51, and is connected at the other end to the second wiring 52.

As shown in FIG. 5B, the contact hole CH22 has an outline matched with the shape of the hole HL2, for instance. Furthermore, the contact hole CH42 is located along the hole HL1. The contact hole CH42 illustrated in FIG. 5B is located along each side of the hole HL1 having a rectangular ring shape.

By such wiring, the capacitor 130 has a structure in which a plurality of structured bodies CS1 and CS2 are connected in parallel.

Fourth Embodiment

Figure 6A:
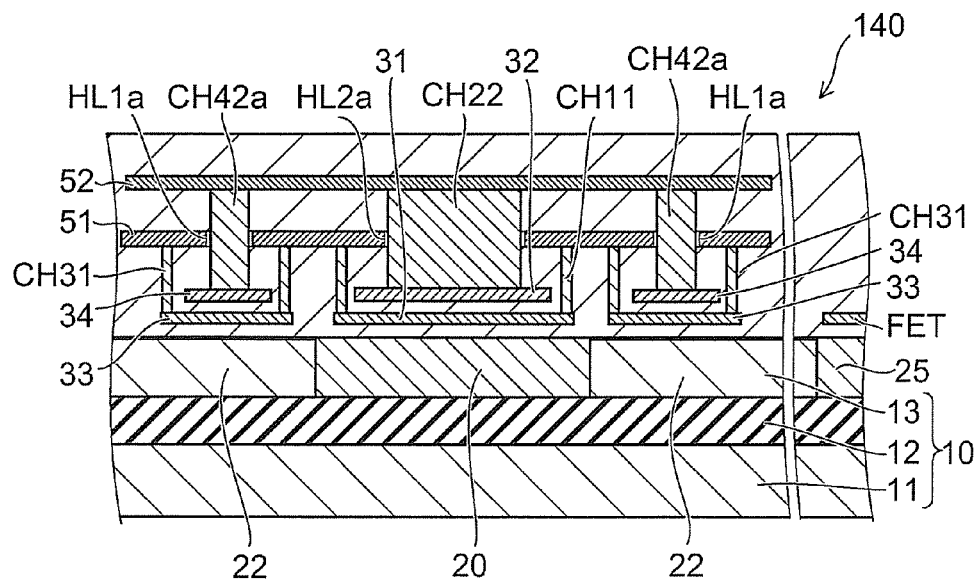
FIGS. 6A and 6B are schematic views illustrating an example configuration of a capacitor according to a fourth embodiment.
Figure 6B:
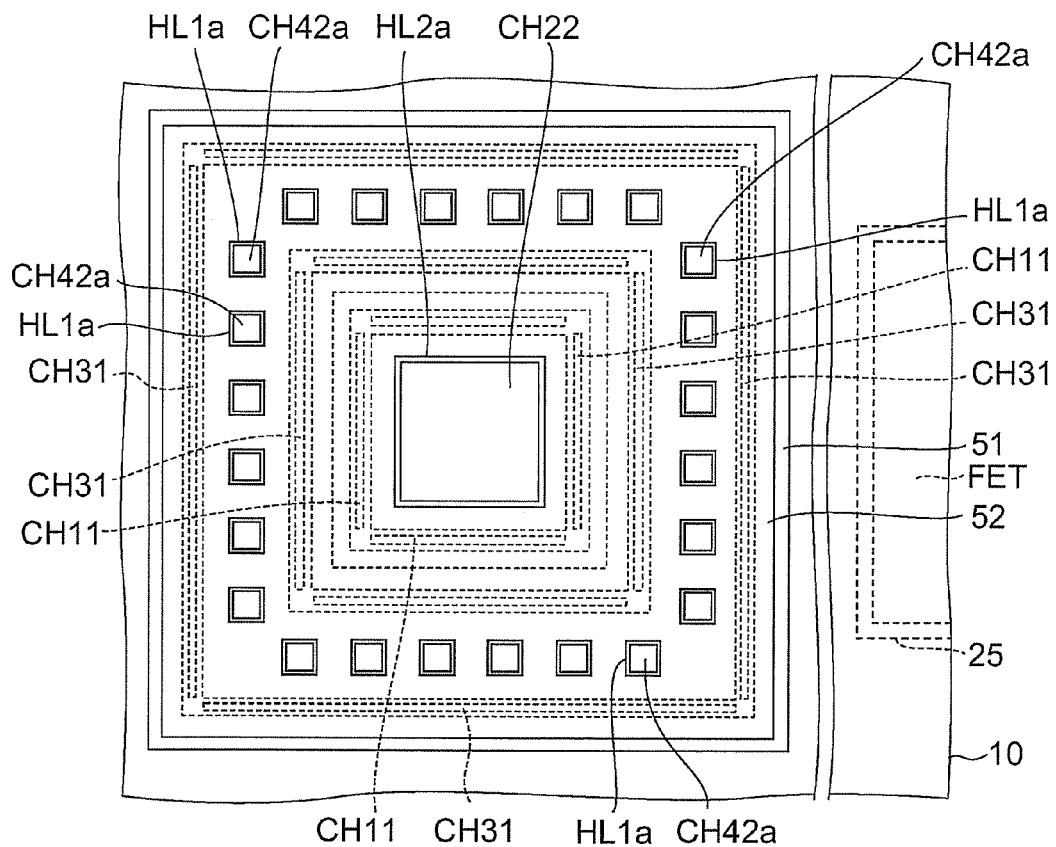

FIGS. 6A and 6B are schematic views illustrating an example configuration of a capacitor according to a fourth embodiment.

Here, FIG. 6A is a schematic cross-sectional view of the capacitor. FIG. 6B is a schematic plan view of the capacitor.

As shown in FIGS. 6A and 6B, the capacitor 140 according to the fourth embodiment is different from the capacitor 130 according to the third embodiment shown in FIGS. 5A and 5B in the configuration of the contact hole CH42a and the holes HL1a and HL2a.

The contact hole CH42a is provided between the fourth electrode 34 and the second wiring 52. The hole HL1a is provided in the first wiring 51 so that the contact hole CH42a penetrates therethrough. The hole HL2a is provided in the first wiring 51 so that the contact hole CH22 penetrates therethrough.

In the capacitor 140 according to the fourth embodiment, the contact hole CH42a is provided like a pillar. A plurality of the contact holes CH42a are provided along the outline of the fourth electrode 34. The size of the hole HL1a allowing this contact hole CH42a to penetrate therethrough is slightly larger than the outline of the contact hole CH42a.

The size of the hole HL2a allowing the contact hole CH22 to penetrate therethrough is slightly larger than the outline of the contact hole CH22.

In the capacitor 140 according to the fourth embodiment as described above, the size of the holes HL1a and HL2a provided in the first wiring 51 is reduced to the minimum required to allow the contact holes CH42a and CH22 to penetrate therethrough. Hence, the capacitor 140 suppresses the increase of the wiring resistance of the first wiring 51 due to the holes HL1a and HL2a. This realizes resistance reduction of the first wiring 51.

Fifth Embodiment

Figure 7A:
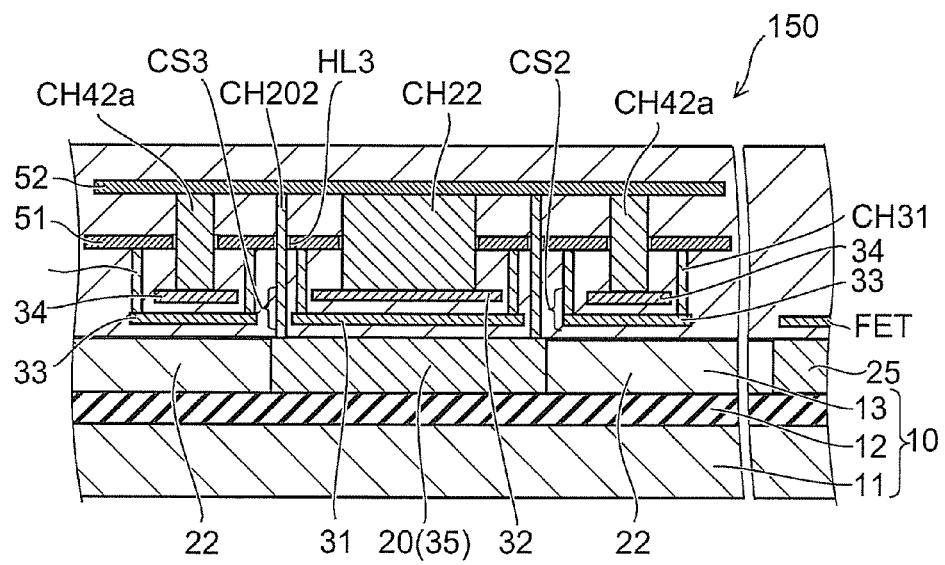
FIGS. 7A and 7B are schematic views illustrating an example configuration of a capacitor according to a fifth embodiment.
Figure 7B:
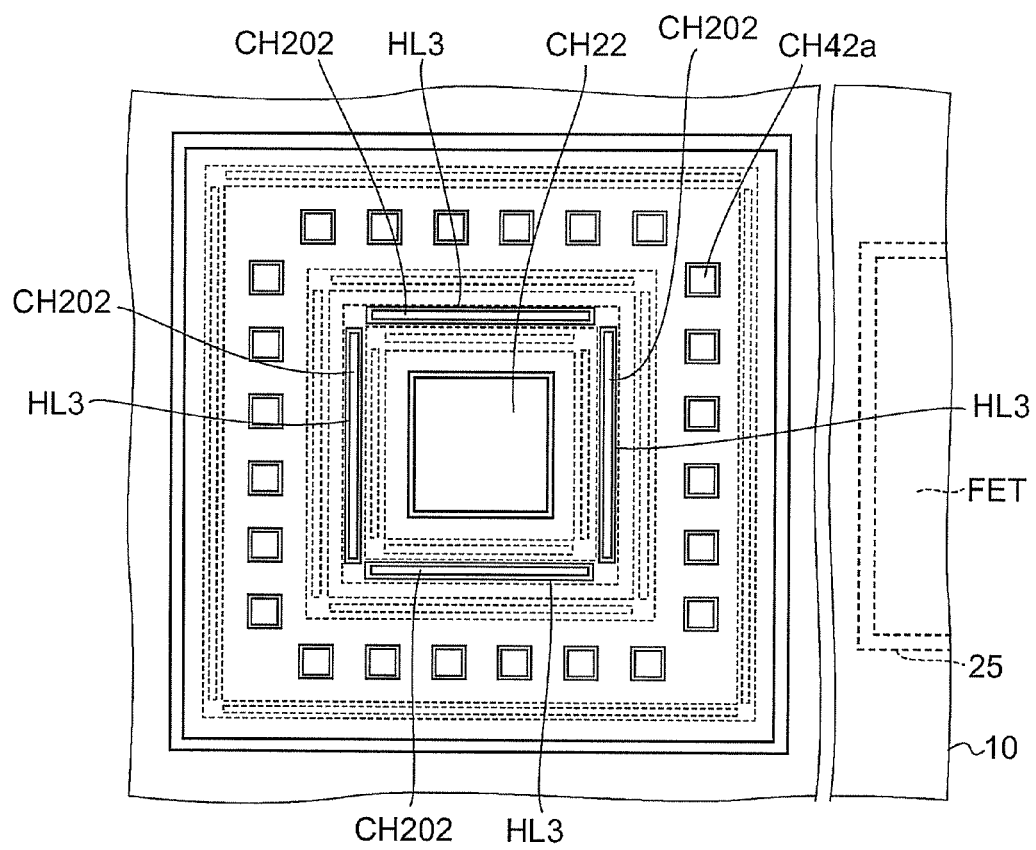

FIGS. 7A and 7B are schematic views illustrating an example configuration of a capacitor according to a fifth embodiment.

Here, FIG. 7A is a schematic cross-sectional view of the capacitor. FIG. 7B is a schematic plan view of the capacitor.

As shown in FIGS. 7A and 7B, the capacitor 150 according to the fifth embodiment is different from the capacitor 140 according to the fourth embodiment shown in FIGS. 6A and 6B in that a contact hole CH202 for establishing electrical continuity between the dummy active region 20 and the second wiring 52 is added.

The contact hole CH202 is connected at one end to the dummy active region 20, penetrates through the hole HL3 of the first wiring 51, and is connected at the other end to the second wiring 52. The dummy active region 20 is brought into electrical continuity with the second wiring 52 by the contact hole CH202 and functions as a fifth electrode 35. That is, in the capacitor 150, the fifth electrode 35, the first electrode 31, and the second electrode 32 in combination with the first dielectric portion 40 located therebetween form a structured body CS3 for accumulating charge. In the structured body CS3, charge is accumulated between each pair of the three electrodes, i.e., the fifth electrode, the first electrode 31, and the second electrode 32. Hence, the capacitance density can be made even higher than in the capacitor 140 according to the fourth embodiment.

Sixth Embodiment

Figure 8A:
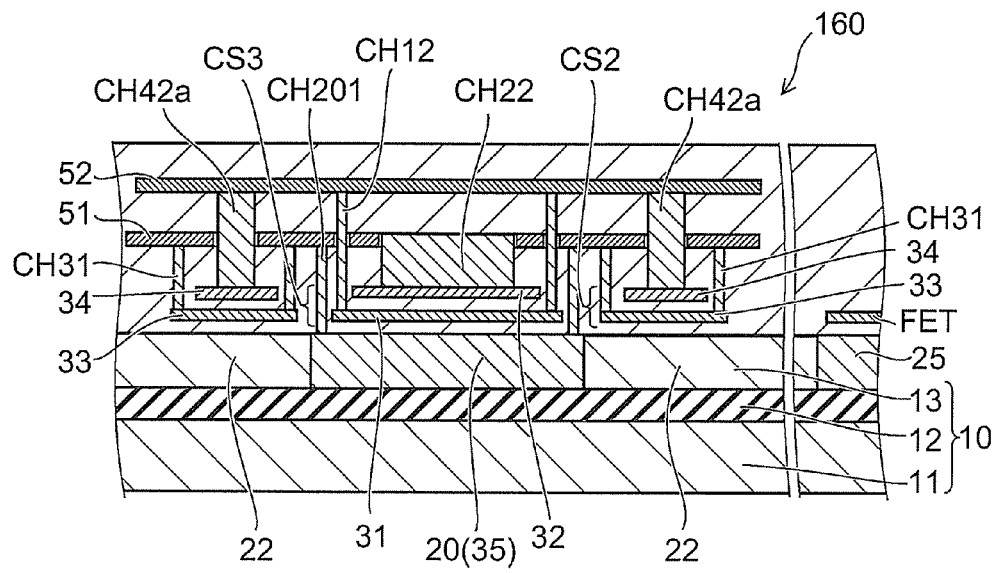
FIGS. 8A and 8B are schematic views illustrating an example configuration of a capacitor according to a sixth embodiment.
Figure 8B:
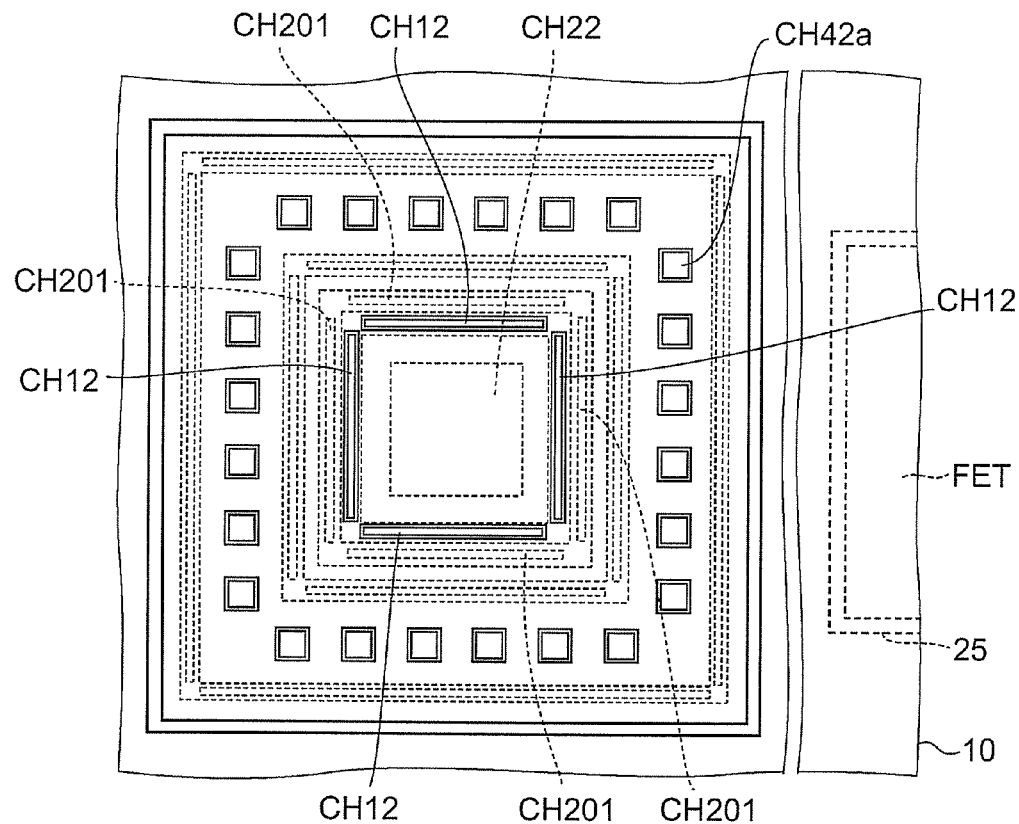

FIGS. 8A and 8B are schematic views illustrating an example configuration of a capacitor according to a sixth embodiment.

Here, FIG. 8A is a schematic cross-sectional view of the capacitor. FIG. 8B is a schematic plan view of the capacitor.

As shown in FIGS. 8A and 8B, the capacitor 160 according to the sixth embodiment is different from the capacitor 150 according to the fifth embodiment shown in FIGS. 7A and 7B in the configuration of the wiring of the structured body CS3.

More specifically, in the capacitor 160, the first electrode 31 and the second wiring 52 are connected by the contact hole CH12. The second electrode 32 and the first wiring 51 are connected by the contact hole CH22. Furthermore, in the capacitor 160, the dummy active region 20 and the first wiring 51 are connected by the contact hole CH201 as necessary.

Here, the first electrode 31 and the third electrode 33 are in the same layer. The second electrode 32 and the fourth electrode 34 are in the same layer.

In the capacitor 160, the first electrode 31 of the structured body CS3 is connected to the second wiring 52. The third electrode 33 of the structured body CS2 located adjacent to the structured body CS3 is connected to the first wiring 51.

Likewise, in the capacitor 160, the second electrode 32 of the structured body CS3 is connected to the first wiring 51. The fourth electrode 34 of the structured body CS2 located adjacent to the structured body CS3 is connected to the second wiring 52.

That is, in the capacitor 160, with regard to the structured bodies CS2 and CS3, the polarity of applied voltage is reversed between adjacent electrodes in the same layer.

Figure 9:
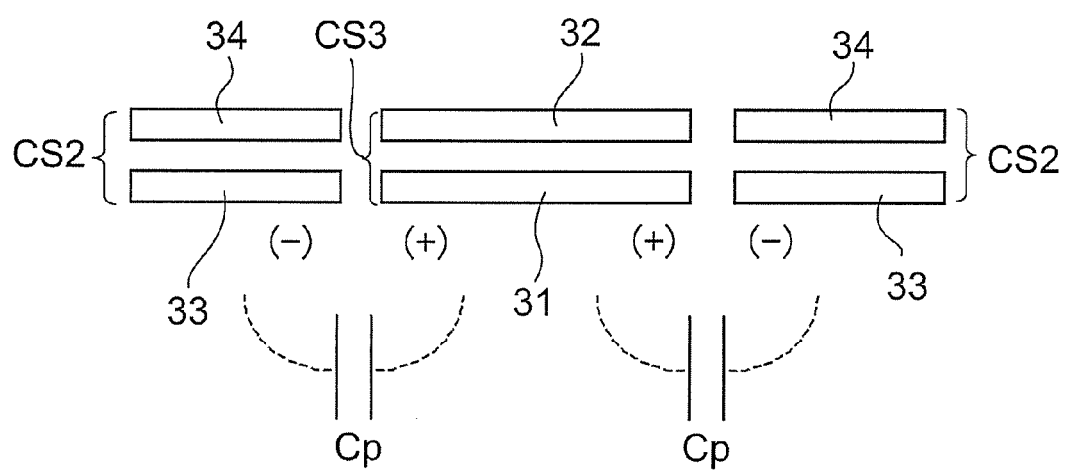
FIG. 9 is a schematic view illustrating the polarity of voltage between adjacent electrodes in the same layer.

FIG. 9 is a schematic view illustrating the polarity of voltage between adjacent electrodes in the same layer.

For instance, in the case where the first electrode 31 is applied with a positive (+) voltage, the third electrode 33 adjacent to the first electrode 31 in the same layer is applied with a negative (−) voltage. In this state, a parasitic capacitance (fringe parasitic capacitance) Cp occurs at the edge between the adjacent electrodes in the same layer. Hence, in the capacitor 160, the parasitic capacitance Cp is added to the capacitance of the respective structured bodies CS2 and CS3. Thus, the capacitance density can be further increased.

Seventh Embodiment

Figure 10:
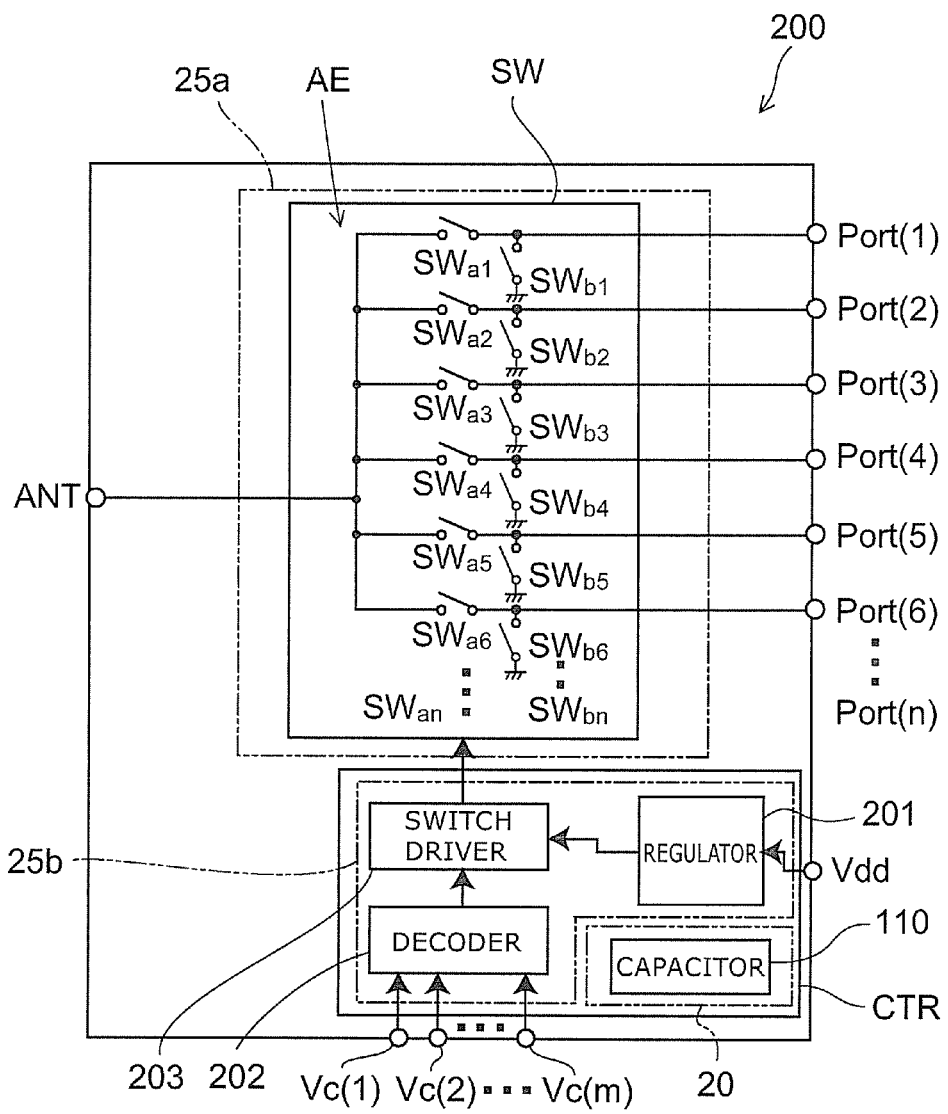
FIG. 10 is a circuit diagram illustrating an example configuration of an integrated device according to a seventh embodiment.

FIG. 10 is a circuit diagram illustrating an example configuration of an integrated device according to a seventh embodiment.

Figure 11:
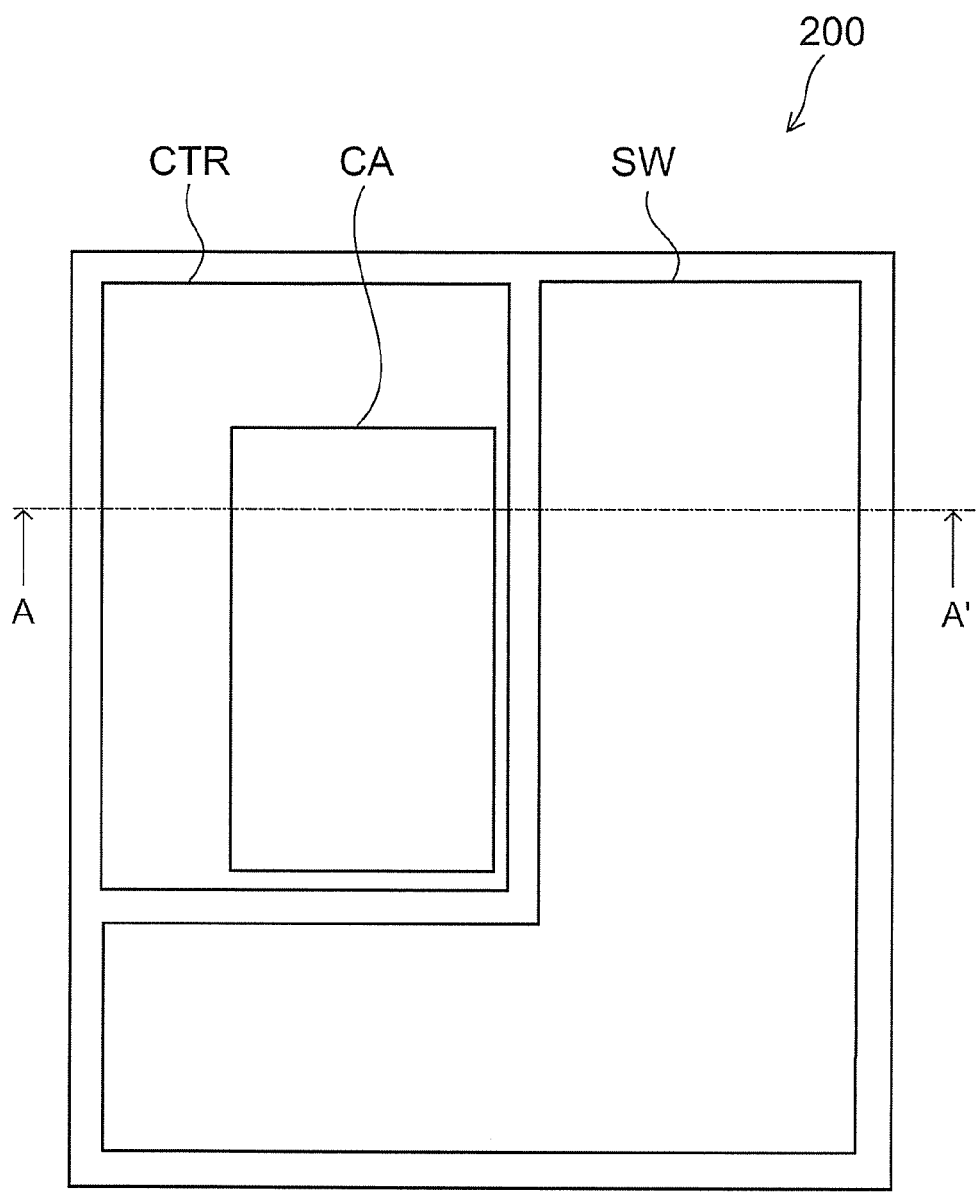
FIG. 11 is a block diagram illustrating an example layout of the integrated device according to the seventh embodiment.

FIG. 11 is a block diagram illustrating an example layout of the integrated device according to the seventh embodiment.

As shown in FIG. 10, the integrated device 200 includes an active element AE formed in a first active region 25a, a control section CTR formed in a second active region 25b, and a capacitor 110 provided in a dummy active region 20.

Here, the integrated device 200 is e.g. a radio frequency switching device. In the radio frequency switching device, the active element AE for handling radio frequency signals (signals used for wireless communication) is based on e.g. FET (field effect transistor). In the following, a radio frequency switching device is described as an example of the integrated device 200.

As shown in FIG. 10, the integrated device (radio frequency switching device) 200 includes a switching element section SW and a control section CTR. The integrated device 200 is a device for switching connection between an antenna ANT and n ports Port(1) to Port(n).

The switching element section SW includes switches SWa1 to SWan parallel connected to the connection line to the antenna ANT. Furthermore, the switching element section SW includes switches SWb1 to SWbn provided between the ground and the n ports Port(1) to Port(n), respectively.

The control section CTR includes a regulator 201, a decoder 202, and a switch driver 203. The regulator 201 converts the supplied power supply voltage Vdd to a prescribed voltage and applies it to the switch driver 203. The decoder 202 decodes control signals (e.g., signals Vc(1) to Vc(m)) and applies them to the switch driver 203. In response to the signals applied from the decoder 202, the switch driver 203 performs opening/closing operation on the switches SWa1 to SWan and SWb1 to SWbn of the switching element section SW.

FIG. 11 schematically illustrates the layout in the chip of the integrated device 200. The inside of the chip of the integrated device 200 is partitioned into a region where the switching element section SW is located and a region where the control section CTR is located. A capacitor region CA is provided in the control section CTR.

Figure 12:
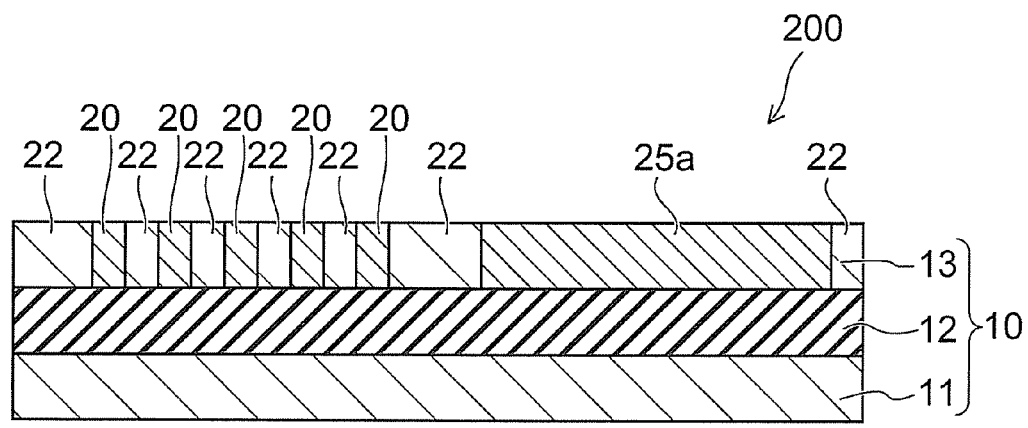
FIG. 12 is a schematic cross-sectional view on arrow taken along line A-A' in FIG. 11.

FIG. 12 is a schematic cross-sectional view on arrow taken along line A-A' in FIG. 11.

The control circuit CTR, the capacitor region CA, and the switching element section SW of the integrated device 200 are provided in the semiconductor layer 13 of the substrate 10. In the switching element section SW, the switches SWa1 to SWan and SWb1 to SWbn are respectively based on active elements such as transistors. Hence, the switching element section SW is provided in the first active region 25a.

In the integrated device 200, the first active region 25a including the switching element section SW is located at a specific position. Thus, in order to uniformly planarize various films in the manufacturing process, a dummy active region 20 is provided besides the first active region 25a. For instance, the dummy active region 20 is divided into a plurality of portions and provided at positions suitable in design. The dummy active region 20 is electrically isolated from the first active region 25a by the isolation region 22.

The capacitor region CA is provided in this dummy active region 20. In the integrated device 200 illustrated in FIG. 12, a plurality of dummy active regions 20 are located adjacent to the first active region 25a. In this dummy active region 20, the capacitors 110, 120, 130, 140, 150, and 160 according to the above embodiments are provided.

In the substrate 10, the first active region 25a is electrically isolated from the dummy active region 20 by the insulating layer 12 and the isolation region 22. Hence, the influence of radio frequency signals handled in the switching element section SW formed in the first active region 25a is not transmitted to the dummy active region 20. Thus, the capacitors 110, 120, 130, 140, 150, and 160 provided in the dummy active region 20 can sufficiently realize their characteristics.

Furthermore, the space above the dummy active region 20 required in the manufacturing process can be effectively utilized. Hence, the capacitance density of the capacitors 110, 120, 130, 140, 150, and 160 can be increased.

Here, the integrated device 200 is not limited to the radio frequency switching device. The integrated device 200 may include other circuits.

Eighth Embodiment

Figure 13:
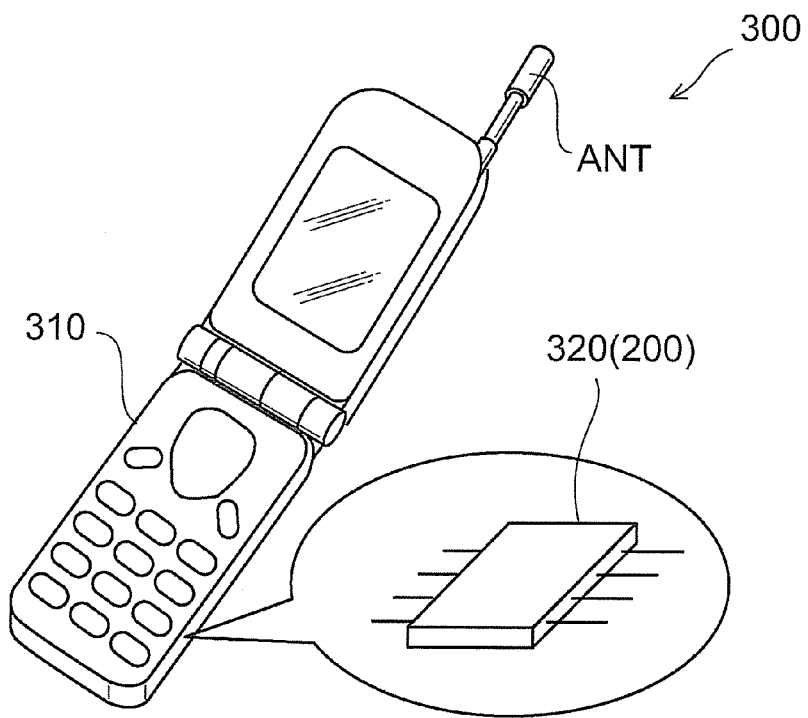
FIG. 13 is a schematic perspective view illustrating an example configuration of an electronic apparatus according to an eighth embodiment.

FIG. 13 is a schematic perspective view illustrating an example configuration of an electronic apparatus according to an eighth embodiment.

The electronic apparatus 300 according to the eighth embodiment includes a radio frequency switching device 320 in a housing 310. The electronic apparatus 300 is e.g. a mobile phone. The radio frequency switching device is illustratively the integrated device 200 according to the seventh embodiment.

The radio frequency switching device 200 is provided between an antenna ANT and an internal circuit. In response to a prescribed control signal, the radio frequency switching device 200 selects one of a plurality of ports Port(1) to Port (n). The signal received by the antenna ANT is sent through the selected port to the internal circuit. The signal output from the internal circuit is sent through the selected port to the antenna ANT.

The electronic apparatus 300 has higher capacitance density than electronic apparatuses without the integrated device 200. Thus, the electronic apparatus 300 realizes sufficient switching characteristics by the capacitors 110, 120, 130, 140, 150, and 160 in which the influence of radio frequency signals is suppressed. In the case where the electronic apparatus 300 is a mobile phone, the band switching characteristics of the mobile phone can be improved.

The embodiments of the invention and the variations thereof have been described above. However, the invention is not limited to these examples. For instance, in the above embodiments, one of the structured bodies CS, CS1, and CS3 is provided in one dummy active region 20. However, a plurality of structured bodies CS, CS1, and CS3 may be provided in one dummy active region 20.

Furthermore, those skilled in the art can modify the above embodiments and the variations thereof by suitable addition, deletion, and design change of components, and by suitable combination of the features of the embodiments. Such modifications are also encompassed within the scope of the invention as long as they fall within the spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A capacitor comprising:
   a substrate including an insulating layer and a semiconductor layer provided on the insulating layer, the semiconductor layer including a dummy active region electrically isolated from an active region including an active element;
   a first electrode and a second electrode located to oppose each other above the dummy active region; and
   a first dielectric portion provided between the first electrode and the second electrode, a third electrode and a fourth electrode located to surround on all sides of the first electrode and the second electrode and oppose each other above the semiconductor layer; and
   a second dielectric portion provided between the third electrode and the fourth electrode,
   one of the third electrode and the fourth electrode being connected to the ground terminal.

2. The capacitor according to claim 1, further comprising: a ground terminal placed at a ground potential.

3. The capacitor according to claim 2, further comprising:
   an isolation region provided between the dummy active region and the active region,
   the third electrode, the fourth electrode, and the second dielectric portion being provided above the isolation region.

4. The capacitor according to claim 2, wherein
   the first electrode, the second electrode, and the first dielectric portion constitute a first structured body,
   the third electrode, the fourth electrode, and the second dielectric portion constitute a second structured body, and
   the second structured body is provided to surround the first structured body.

5. The capacitor according to claim 4, wherein
   a plurality of the first structured bodies are provided, and
   the second structured body is provided to surround the plurality of first structured bodies.

6. The capacitor according to claim 4, wherein the first structured body and the second structured body are connected in parallel.

7. The capacitor according to claim 2, further comprising:
   a first wiring; and
   a second wiring placed at a potential different from a potential of the first wiring,
   the first electrode and the third electrode being connected to the first wiring, and
   the second electrode and the fourth electrode being connected to the second wiring.

8. The capacitor according to claim 2, further comprising:
   a first wiring; and
   a second wiring placed at a potential different from a potential of the first wiring, wherein
   of the first electrode, the second electrode, the third electrode, and the fourth electrode, one of the electrodes adjacent along a major surface of the semiconductor layer being connected to the first wiring and one other electrode being connected to the second wiring.

* * * * *